United States Patent [19]

Liu et al.

[11] Patent Number: 5,180,689
[45] Date of Patent: Jan. 19, 1993

[54] TAPERED OPENING SIDEWALL WITH MULTI-STEP ETCHING PROCESS

[75] Inventors: Hsien-Tsung Liu, Keelung; Jin-Yuan Lee, Hsin-Chu; Jiann-Kwang Wang, Hsin Chu; Chue-San Yoo, Taipei; Pei-Jan Wang, Taichung, all of Taiwan

[73] Assignee: Taiwan Semiconductor Manufacturing Company, Hsinchu, Taiwan

[21] Appl. No.: 757,135

[22] Filed: Sep. 10, 1991

[51] Int. Cl.⁵ .......................................... H01L 21/465
[52] U.S. Cl. .................... 437/228; 437/187; 437/981; 156/653
[58] Field of Search ................ 156/643, 644, 652–653; 437/225, 228, 203

[56] References Cited

U.S. PATENT DOCUMENTS

| | | | |
|---|---|---|---|
| 4,372,034 | 2/1983 | Bohr | |
| 4,484,979 | 11/1984 | Stocker | 156/643 |
| 4,807,016 | 2/1989 | Douglas | 156/653 |
| 4,814,041 | 3/1989 | Auda | 156/653 |
| 4,832,788 | 5/1989 | Nemirof | 156/652 |
| 4,902,377 | 2/1990 | Berglund et al. | 156/643 |
| 4,908,333 | 3/1989 | Shimokawa et al. | |
| 5,003,062 | 3/1991 | Yen | |
| 5,026,666 | 6/1991 | Hills et al. | 156/643 |
| 5,034,091 | 7/1991 | Trask et al. | 156/643 |

Primary Examiner—Olik Chaudhuri
Assistant Examiner—H. Jey Tsai
Attorney, Agent, or Firm—George O. Saile

[57] ABSTRACT

A method is described for making a tapered opening for an integrated circuit having a feature size of about one micrometer or less which will in due course be filled with a metallurgy conductor. An integrated circuit structure is provided having device elements within a semiconductor substrate and multilayer insulating layers thereover. A resist masking layer is formed over the said multilayer insulating layer having openings therein in the areas where the said openings are desired. The multilayer insulating layer is anisotropically etched through a first thickness to form a first opening using the resist masking layer as a mask. A second thickness portion of the multilayer insulating layer is isotropically etched to substantially uniformly enlarge and taper the first opening while using the unchanged resist layer. The remaining thickness of the multilayer insulating layer is anisotropically etched through to the semiconductor substrate to form the desirable tapered opening with a metal step coverage improvement over the state of the art between about 20 to 60%. Metal step coverage is defined as the ratio of thickness of the thinnest metal in the contact hole to the metal thickness on the horizontal area. The resist layer mask is removed.

20 Claims, 4 Drawing Sheets

TAPERED OPENING SIDEWALL WITH MULTI-STEP ETCHING PROCESS

BACKGROUND OF THE INVENTION

1. Field of the Invention

The invention relates to the manufacture of very highly dense integrated circuits and more particularly to the method of formation of tapered contact openings to device elements of the integrated circuits. These device elements include device regions within the semiconductor substrate and metallurgy layers within a multilayer insulator and metallurgy structure.

2. Description of the Prior Art

Insulating multilayers are normally formed over the highly dense integrated circuits which are formed in and on a semiconductor substrate. These layers are thick in comparison to the feature size of one micrometer or less of the very dense integrated circuits which are now being manufactured. This thickness cannot be scaled down proportionately in the same way the feature size is scaled down. The layers are composed of silicon oxide, silicon nitride, glasses and the like insulators.

There are also multilayer insulator and metallurgy layers above the above mentioned insulating multilayers which connect the device structures within the semiconductor substrate into circuit structures. These layers are also thick in comparison to the feature size of one micrometer or less of the very dense integrated circuits which are now being manufactured. This thickness cannot be scaled down proportionately in the same way the feature size is scaled down. The layers are typically composed of silicon oxide, a silicate or siloxane spin-on-glass and silicon oxide composite layer.

It is necessary to make tapered contact openings through these above mentioned relatively thick insulating multilayers to the device elements formed in and on the semiconductor substrate and metallurgy layers within a multilayer of insulating and metallurgy layers. These openings are formed in the prior art by isotropic etching, anisotropic etching or a combination of these two etching techniques and heating steps to cause smoothing by flow of the insulator layer. A great amount of work and effort has been expended to find the best technique to form ideal tapered openings to the device elements. The need for tapered openings is so that the subsequent step of depositing a metal layer, for example aluminium will properly fill the opening and make an ohmic contact to the various device elements of the integrated circuit. Examples of patents that have tried to solve this problem are R. K. Berglund et al U.S. Pat. No. 4,902,377; M. H. Nemiroff U.S. Pat. No. 4,832,788; K. Shimokawa et al U.S. Pat. No. 4,908,333; Huebner U.S. Pat. No. 4,980,310; and B. Auda U.S. Pat. No. 4,814,041.

A copending patent application Ser. No. 07/713,508 filed Jun. 12, 1991 of C. S. Yoo, S. H. Kuo and T. H. Lin entitled "Contact Sidewall Tapering With Argon Sputtering" is directed to overcome the above mentioned heat to flow problem by using argon sputter etching rather than heat to flow the glass.

It has been recognized in the prior art that the high temperature heating that is generally used to flow the insulating layer, typically glass to smooth the sharp edges of contact opening can do damage to the integrated circuit device elements. For example, M. T. Bohr U.S. Pat. No. 4,372,034 describes a process wherein he uses a very deep isotropic etch through the glass insulating layer and then an anisotropic etch to pass through the thin silicon dioxide layer. He says that the high temperature heating step is not now required. However, this process can only be used in the past or where very simple and large size semiconductor devices are being made, because of the very large space taken up by the isotropic etch at each opening.

The high density integrated circuit devices wherein the feature sizes are less than about one micrometer or less have created very difficult problems involving the conservation of horizontal space. Also, there is the problem of the high temperature flow of the glass insulating layer for smoothing. The high temperature flow causes device problems, such as where a refractory silicide, for example titanium silicide is used in the conventional SALICIDE process. The major device problem caused in this instant is the high temperature increase in contact resistance due to silicide degradation. The longer thermal budget may degrade the submicron device performance.

The use of cured silicate or siloxane spin-on-glass layer is also generally known in the prior art and used in multilayer insulating layer and metallurgy composites to electrically connect the integrated circuit device. This may be better understood with reference to the Daniel L. Yen U.S. Pat. No. 5,003,062 entitled "Semiconductor Planarization Process for Submicron Devices".

SUMMARY OF THE INVENTION

It is an object of this invention to overcome the disadvantages of the prior art in forming tapered openings in insulating multilayers by use of a combination of anisotropic etching, isotropic etching, anisotropic etching to form ideal tapered openings without use of a high temperature flow step and while conserving horizontal space.

It is another object of this invention to form tapered openings in a thick insulating layer to regions within the semiconductor substrate by use of a combination of anisotropic etching, isotropic etching, anisotropic etching to form ideal tapered openings without use of a high temperature flow step and while conserving horizontal space.

It is still another object of this invention to form tapered openings in a thick spin-on-glass insulating layer to metallurgy layer regions above the semiconductor substrate by use of a combination of anisotropic etching, isotropic etching, anisotropic etching to form ideal tapered openings without use of a high temperature flow step and while conserving horizontal space.

In accordance with the present invention, a method is described for making a tapered opening for an integrated circuit having a feature size of about one micrometer or less which will in due course be filled with a metallurgy conductor. An integrated circuit structure is provided having device elements within a semiconductor substrate and multilayer insulating layers thereover. A resist masking layer is formed over the said multilayer insulating layer having openings therein in the areas where the said openings are desired. The multilayer insulating layer is anisotropically etched through a first thickness to form a first opening using the resist masking layer as a mask. A second thickness portion of the multilayer insulating layer is isotropically etched to substantially uniformly enlarge and taper the first opening while using the unchanged resist layer. The remaining thickness of the multilayer insulating layer is anisotropically etched through to the semiconductor substrate to form the desirable tapered opening with a metal step coverage improvement over the state of the art between about 20 to 60%. Metal step coverage is defined as the ratio of thickness of the thinnest metal in the contact hole to the metal thickness on the horizontal area. The resist layer mask is removed.

The tapered openings can be made through either the insulating layer to contact the device elements within the semiconductor substrate or through the insulating spin-on-glass layer to connect device elements such as the metallurgy layer over the semiconductor substrate. The process will have some differences, because the different materials and particularly due to the sensitive problems with etching spin-on-glasses. One particular difference involves the isotropic etching step. The isotropic etching step must be a dry, not wet etching step with a particular preferred etchant being $NF_3$, $CHF_3$ or $CCF_4$ under the conditions of temperature about 75° C., power of about 600 watts, time about 1 minute depending upon the dielectric layer thickness.

DESCRIPTION OF THE PREFERRED EMBODIMENTS

Figure 1:
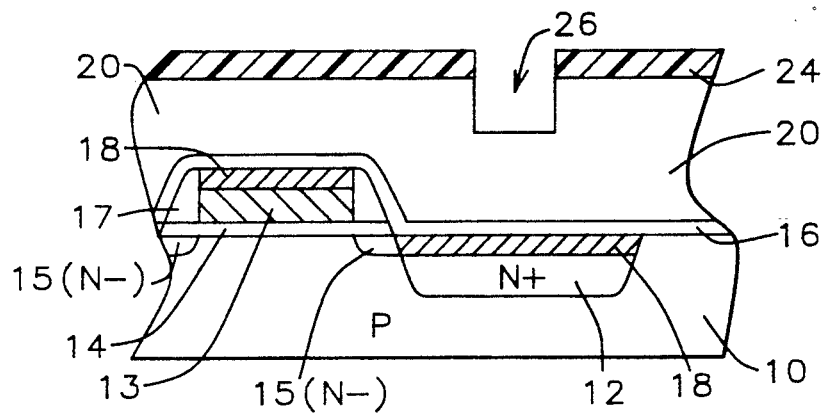
FIGS. 1 through 4 is a schematic, cross-sectional representation of one embodiment of the present invention for making a tapered opening.

Referring to FIG. 1 there is shown a product in a stage of manufacture after the contact windows or openings have been etched by a first anisotropic etchant to a first thickness of the insulating layer. The product under manufacture can be an N-channel MOSFET, a P-channel MOSFET, a CMOS FET, bipolar transistor or combinations thereof. However, the FIGS. 1 through 4 process is intended to schematically show a NMOS portion of a CMOS FET process that makes a electrical contact to both P+ and N+ source/drain regions. The substrate 10 is monocrystalline silicon and has been doped by conventional techniques to either P or N as is appropriate for the desired N-channel or P-channel MOS FET structure. An example of such a conventional process is described in the book "VLSI TECHNOLOGY" Second Edition by S. M. Sze Published by McGraw-Hill Book Co., New York, N.Y. 1988 pages 485-487.

Source/drain regions 12 with lightly doped drains 15, gate dielectric 13 and gate electrode 14 are formed by conventional methods as described, for example by Sze cited above in the appropriate wells of substrate 10. Conventional sidewall insulator structures 17 have been formed upon the sides of the gate dielectric 13 and gate electrode 14 for insulating purposes.

The self aligned metal silicide layer is now to be formed on the polycrystalline silicon regions 14 and the exposed source/drain monocrystalline silicon regions 12. A thin layer of metal film is deposited upon the surface of the wafer. The metals that are useful in my invention include titanium, cobalt, tantalum, molybdenum, tungsten, palladium and platinum. The metal can be deposited by sputtering or evaporation methods. It is preferably deposited by sputtering. The operational thickness is between about 300 to 1500 Angstroms and the preferred thickness is between about 800 to 1000 Angstroms. The preferred metal for this metal silicide is titanium. Alternatively, the metal silicides can be formed with chemical vapor deposition.

The structure having the metal layer formed thereover the layers 14 and source/drain regions 12 is now placed within a chamber having an inert atmosphere such as nitrogen, argon or a vacuum. The structure is heated within this chamber to react the metal with the polycrystalline silicon layer regions and the monocrystalline silicon regions to form metal silicide layers or contacts 18. The metal is left unreacted where it covers the non-silicon regions. The heating conditions for the reaction are 600° to 800° C. in a conventional furnace for about 20 to 40 minutes or in rapid thermal anneal system for 10 to 60 seconds. The unreacted portions of the metal layer are then removed by exposing the structure to an etchant selective for the metal but not reactive to the metal silicide layer or contact 18. Typical etchants are solution of ammonium hydroxide, hydrogen peroxide and DI water. After cleanup the unreacted metal film or metal nitride on the oxide surface, a second anneal either by furnace or by rapid thermal anneal at 800° to 900° C. stabilizes the metal silicide films.

While the metal silicide structure is illustrated above in detail, it will be obvious to those skilled the art that the silicide need not be used. Conventional contact metallurgy can be used.

An insulating layered structure composed of a layer of silicon oxide 16 and a much thicker layer of borophosphosilicate glass, phosphosilicate glass or similar insulating layer 20. The operational thicknesses of these layers are between about 1000 to 2000 Angstroms for the oxide layer and between about 4000 to 10,000 or more Angstroms for the glasseous layer. These layers are typically deposited by chemical vapor deposition in low pressure or atmospheric pressure, or in a plasma enhanced reactive chamber.

The contact windows or openings are now to be formed through the insulating layered structure to the source/drain regions 12 having refractory silicide contact 18 thereon in the device regions.

A resist masking layer 24 is formed over the layer 20, exposed and developed. The openings in the resist masking layer are at the desired openings or contact windows. The resist masking layer 24 is composed of a resist material that will not erode during the subsequent anisotropic and isotropic etching processes. Novolak resist products with the usual photoactive compound and solvent is used for this process. One typical commercial that can be used is TSMR-V3 manufactured by Tokyo Ohka Kogyo Co., of Kawasaki, Japan.

A first anisotropic etch step is performed to form substantially vertical sided openings 26 into the layer 20. A plasma etcher is used with a fluorine gas chemistry ambient as is know in the art. The preferred active fluorine ambient is $CHF_3$, because it will not erode the resist. The preferred depth of these opening 26 is between about 1000 to 5000 Angstroms. The result of the anisotropic etching is shown in FIG. 1. The depths of the opening in this step is critical in the formation of the desired tapered openings.

Figure 2:
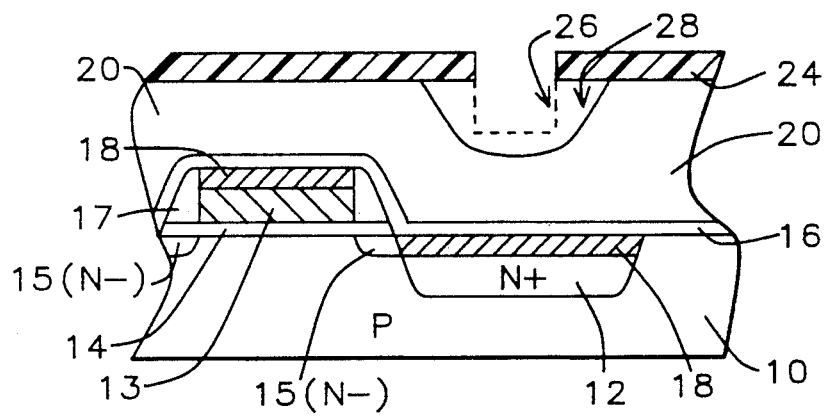

Isotropic etching is now done using 10H2O:1HF ratio buffered HF water solution. The isotropic etching produces etching in both the vertical and the horizontal directions from the openings 26 (shown now in dashed lines) to produce pattern 28 as seen in FIG. 2. The isotropic etching is continued to a second thickness of between about 1000 to 5000 Angstroms of the layer 20. The isotropic etchant does not erode the resist masking layer. Other possible isotropic etchants are in the category of wet etchants are hydrofluoric acid and ammonium fluoride solutions and in the category of dry etchants there are $C_2F_6$ and $CF_4$ which meets these desired characteristics.

Figure 3:
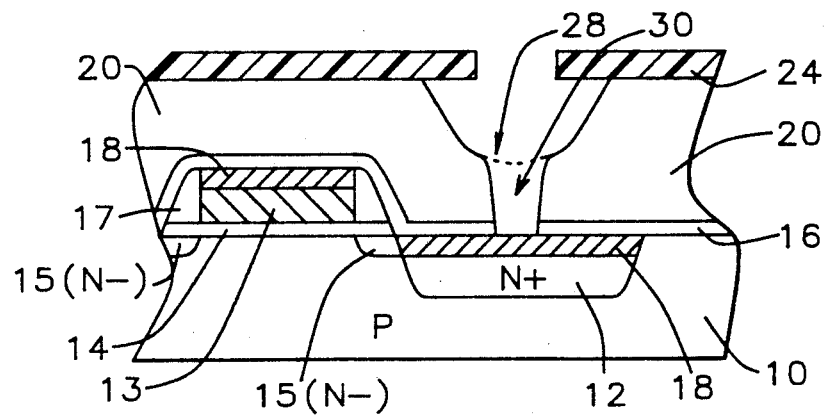

Referring now to FIG. 3, anisotropic etching is now done using plasma etcher and an ambient using fluorine based chemistry gases that do not erode the resist masking layer 24. The anisotropic etching produces etching in only the vertical direction to produce pattern 30 from the previous opening 28 (now shown in dashed lines). The preferred etching ambient is $CHF_3$.

Figure 4:
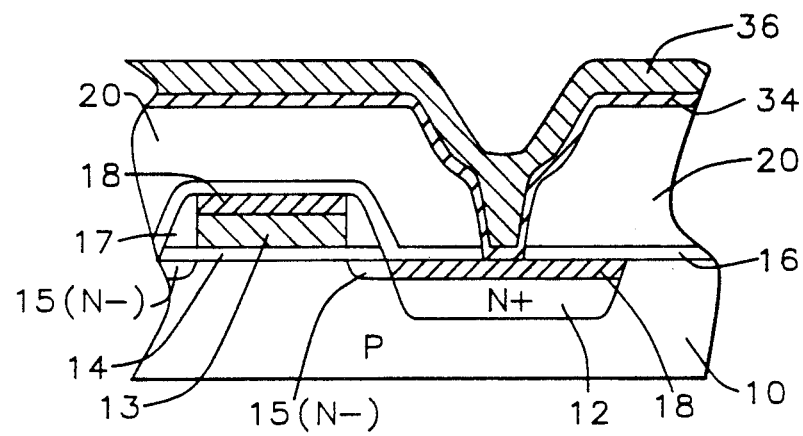

Referring to FIG. 4, the contact metallurgy 34, 36 consists typically of titanium (Ti)/titanium-tungsten(-TiW)/aluminum (Al) are now deposited by a sputtering machine and under the conditions 6 to 12 kwatts. Layer thickness range is 100 to 300 Angstroms for titanium; 1000 to 1500 Angstroms for TiW; 5000 to 9000 Angstroms for Al. The result is that good metal step coverage is found and no high temperature flow processing was needed. For purposes of the drawing the layer 34 includes the Ti/TiW and layer 36 included the Al. The metallurgy can now be patterned by conventional lithography and etching techniques as is none in the art.

Figure 5:
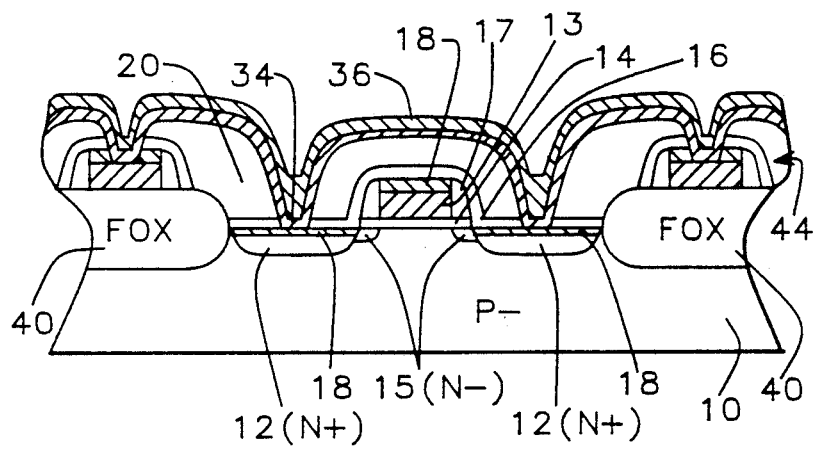
FIG. 5 is a schematic, cross-sectional representation of an LDD MOS field effect transistor integrated device illustrating the problem of different insulating thicknesses through which the tapered opening of the present invention can be made by using the inventive method.

FIG. 5 shows an expanded illustration of the FIG. 1 through 4 embodiment which shows the field oxide isolation, FOX 40 having a conductive line structure 44 thereover. The field oxide isolation 40 is formed before the devices are formed as is know in the art. This drawing illustrates the problem of different thicknesses of the insulating layer 16, 20 and the problem of forming the desired tapered openings through such layers. The above described process allows for this different thickness problem by the second anisotropic etching step. The first anisotropic etching step and the isotropic etching step are processes as described above. The second anisotropic etching step uses an ambient and conditions during etching that allows the etching to proceed through the thicker insulating regions even after the thinner insulating regions have been etched through to the silicon layer. The etching ambient of $CHF_3$, $CF_4$ and Argon preferentially etches the insulator layers over the silicon by a ratio of more than about 10.

Figure 6:
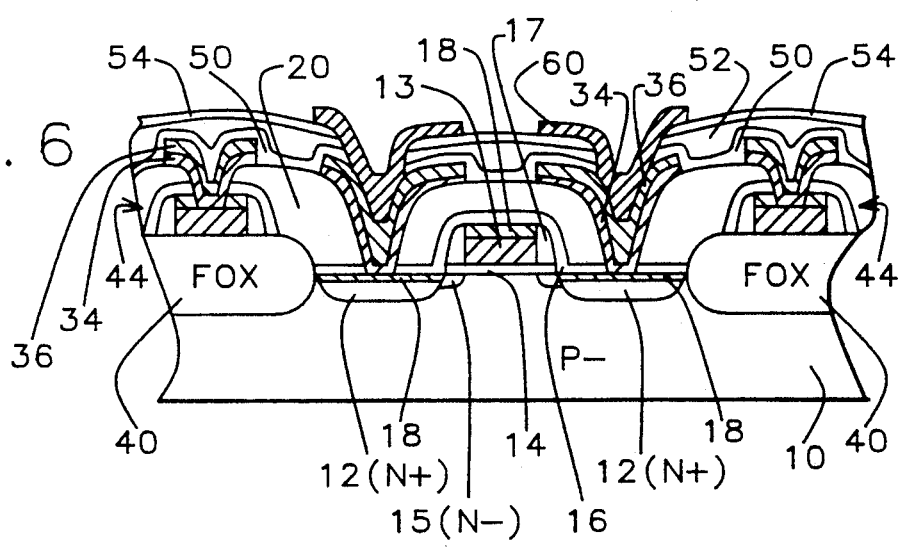
FIG. 6 is schematic, cross-sectional representation of the FIG. 5 device having a multilayer insulating and metallurgy layer structure with tapered openings made through a spin-on-glass composite layer and filled with a conductive metallurgy.

The FIG. 6 illustrates the result of the next series of steps which is done to form a multilayer insulating layered and metallurgy structure for the second level of integrated circuit electrical interconnection. An insulating layered sandwich structure is formed over the patterned metallurgy 34, 36. This sandwich structure includes a thin insulating layer 50 of, for example silicon oxide of between about 2000 to 3000 Angstroms in thickness, a cured spin-on-glass (SOG) layer 52 of between about 1000 to 4000 Angstroms in thickness, and a second thin insulating layer 54 of, for example silicon oxide of between about 4000 to 6000 Angstroms in thickness. The insulating layers of, for example silicon oxide are formed by plasma enhanced chemical vapor deposition.

The spin-on-glass materials and how they are processed are critical to the success of the process for planarization of integrated circuits as described in the above cited in the Daniel L. Yen Patent. The most useful materials are silicates-Si $(OH)_4$ and siloxanes-$(RO)nSi(OH)_{4-n}$. These types of materials are generally known and available. Examples of the silicate type is OCD Type 2 made by Tokyo Okha Corp. and siloxane type is OCD Type 6 made by Tokyo Okha Corp. It is possible to use multiple coating of spin-on-glass. Each spin-on-glass coating is less than about 0.3 micrometers and preferably between about 0.08 and 0.2 micrometers. The more coatings that are used, the better the planarity. The material to be applied is thoroughly mixed in a suitable solvent which is usually a combination of a high boiling point solvent and a low boiling point solvent.

The preferred low boiling point solvents are methanol, ethanol, and propanol. The middle boiling point solvents are buthanol, penthanol, hexanol and methyl cellosolve. The high boiling point solvents are butyl cellosolve, propylene glycol, diethylene glycol and Carbindol. Other potential vehicles or solvents are NMP, HMPA, N.N-dimethylacetoamide, acetyl acetone, and malonic acid diethylester and the like.

The spin-on-glass material suspended in the vehicle or solvent is deposited onto the semiconductor wafer surface and uniformly spread thereover by the action of spinning the wafer. The material fills the indentations in the integrated circuit wafer surface, that is planarization. Most of the vehicle or solvent is driven off by a low temperature baking step. At this point, the critical vacuum degassing step is accomplished by subjecting the wafer to a vacuum of less than about 100 mtorr and 350° C. This last step removes chemical materials which could during latter processing cause cracking and corrosion of the next level conductor material. Other coatings of the spin-on-glass material are applied, baked and vacuum degassed until the desired spin-on-glass layer is formed.

The final step in the making of the spin-on-glass layer 54 is curing. Curing is a high temperature heating step to cause the breakdown of the silicate or siloxane material to a silicon dioxide like cross linked material. Water in the form of steam is the major reaction product of this reaction. The silicate spin-on-glass is cured at about 390° C. and siloxane spin-on-glass is cured at about 450° C. in nitrogen. The spin-on-glass layer 52 is now complete. The curing is done before deposition of the second insulating layer 54.

The second dielectric layer 54 is now formed on top of the SOG layer 52. This layer is formed in a similar manner as was the first layer 50.

Openings are now made through the second insulating layer 54, the SOG layer 52 and the first insulating layer 50 to the first metallurgy layer 34, 36. These openings are made using conventional lithography, but special processing for etching to produce the desired tapered openings in this multilayer composite without resulting in device yield problems after or during the formation of the second metallurgy layer 60 or above metallurgy layers due to outgasing of the SOG and the like. The critical etching are as follows, $CHF_3$ and $CF_4$ plasma at about 40° C. and about 200 mTorr. The etch time is via or opening thickness dependent.

The second metallurgy contact layer 60 is now deposited over the surface of the structure and within the pattern of contact openings to the first metallurgy layer 34, 36. The FIG. 6 shows the metallurgy pattern 60 almost directly above the first metallurgy via, but this need not be done as is understood by those in the art. The metallurgy is preferably aluminum/silicon/copper having a thickness of between about 8000 to 11,000 Angstroms. However, other possible metallurgy include TiN and aluminum/silicon/copper, TiW and aluminum/silicon/copper, aluminum/copper, and the like. The preferred method of depositing this metallurgy is sputtering under the processing conditions for aluminum/silicon/copper of power of 6 kwatts, temperature of 250° C., time of 70 seconds, argon flow rate of 50 sccm and pressure of $10^{-1}$ Pascal. Deposition conditions for TiN are power of 1 kwatt, temperature of 50° C., time of 70 seconds, argon flow rate of 50 sccm and pressure of $10^{-1}$ Pascal. The metallurgy is now patterned into the desired conductive lines by conventional lithography and etching techniques to form the pattern of metal layer 60 in FIG. 6.

The integrated circuit may now be completed with higher levels of metallurgy and passivation as is known to those skilled in the art using the SOG sandwich concept as described above for planarization and tapered openings or vias.

The following Example is given to show the important features of the invention and to aid in the understanding thereof and variations may be made by one skilled in the art without departing from the spirit and scope of the invention.

EXAMPLE

A deposition of 7500 Angstroms of borophophosilicate was deposited upon silicon substrates. A resist masking layer composed of a novolac material as described above was formed with the desired openings using conventional lithography and etching techniques. Tapered contact openings where formed in the borophosphosilicate layer according to the following etching depth plan and using 0.8 feature size in the mask openings:

| Condition | Anisotropic | + | Wet | + | Anisotropic |
|---|---|---|---|---|---|
| 1 | 2500 A. | | 1500 A. | | to endpoint |
| 2 | 2500 | | 2500 | | " |
| 3 | 2500 | | 3500 | | " |
| 4 | 3500 | | 1500 | | " |
| 5 | 3500 | | 2500 | | " |
| 6 | 3500 | | 3500 | | " |
| 7 | 4500 | | 1500 | | " |
| 8 | 4500 | | 2500 | | " |
| 9 | 4500 | | 3500 | | " |

The results of these experiments are given in FIGS. 7 to 10.

Figure 7:
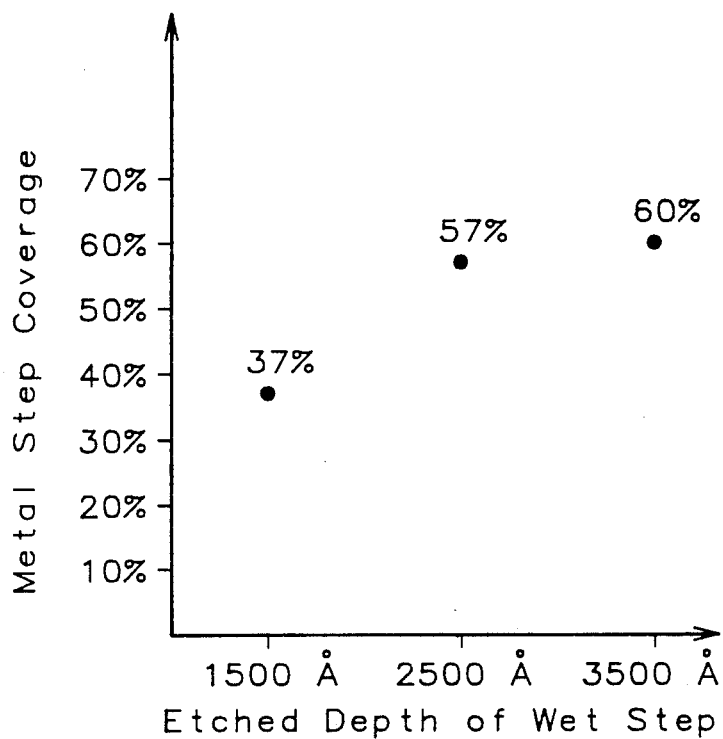
FIGS. 7 through 10 are graphical representations showing results of the experiments described in the Examples.
Figure 8:
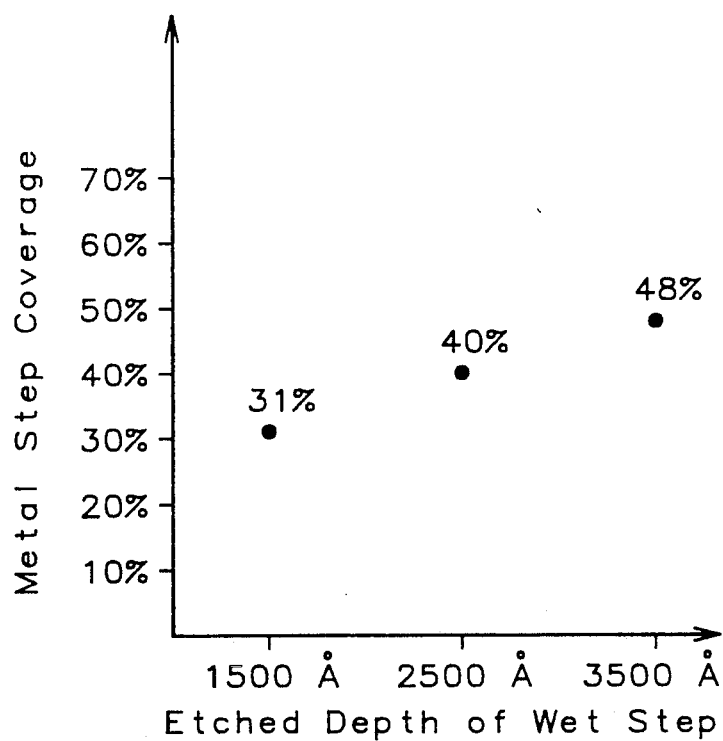
Figure 9:
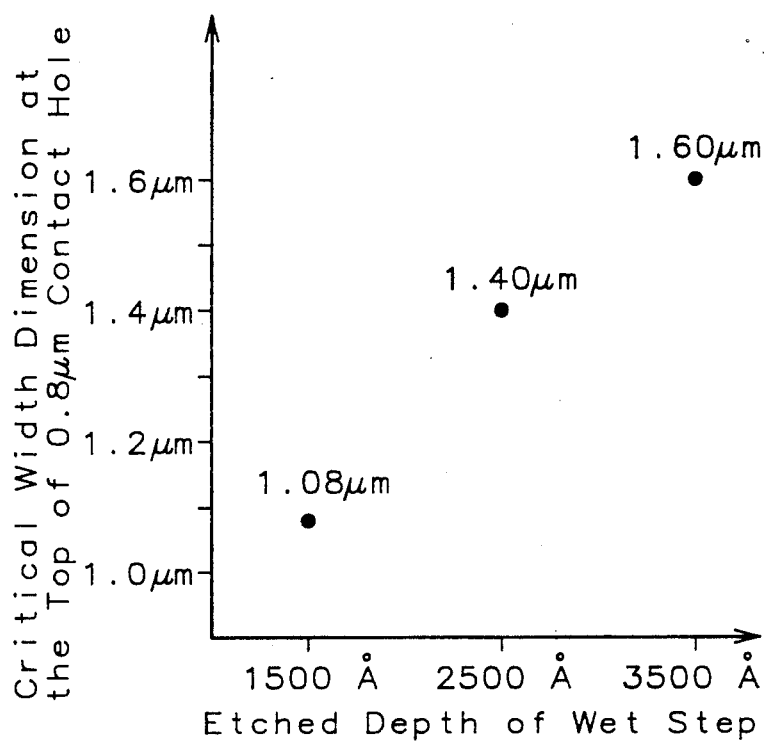
Figure 10:
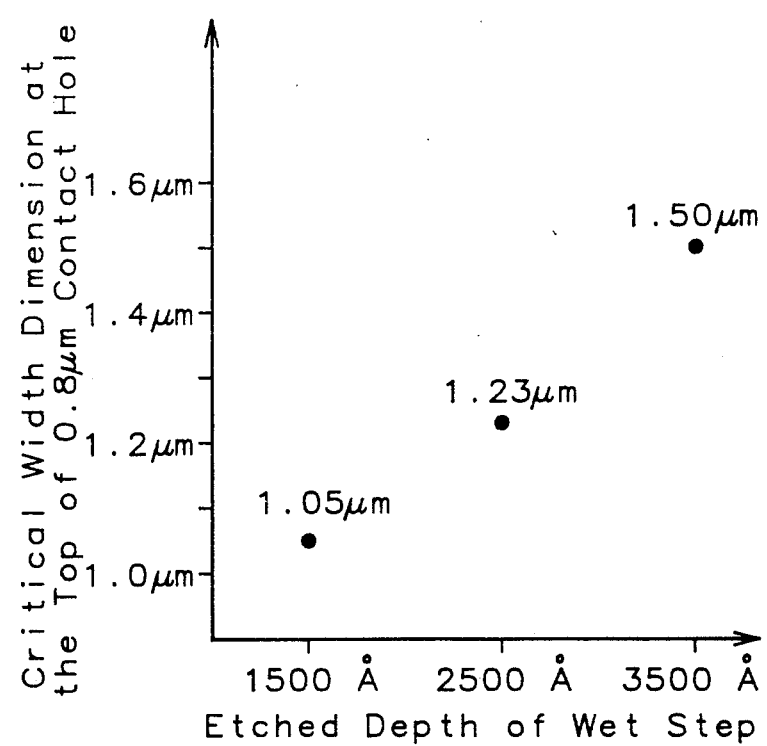

The conclusions from these results are as follows. For the same etched depth in the first anisotropic step, the more borophosphosilicate glass (BPSG) is etched in the wet isotropic etching step, the better the metal step coverage as seen in FIGS. 7 and 8 and the greater critical dimension at the top of contact holes can be obtained as seen in FIGS. 9 and 10. The contact sidewall profile can be adjusted by tailoring the etching time of the first and second steps to meet design rules and metal step coverage. For the same etching time of the wet etching step two, we can get the same top critical dimension of contact hole regardless of the etching time of anisotropic step one and anisotropic step three. Theoretically speaking, the top critical dimensions of the contact holes depend on the etching time of wet etching. So, we can make sure that the uniformity of this multi-step etching process is almost similar to that result from a prior art wet plus dry process. After the three-step etching we can find two profiles on the sidewall as seen in FIG. 3, but if we increase inappropriately the etching time of the isotropic etching step the final profile will become a bowl-like shaped structure. The great disadvantage of such a bowl-like type of contact openings is the serious and critical dimension loss in the horizontal spacing. Our SEM pictures of this experiment, shows that the etching time of the anisotropic step one ranged from 2500 to 4500 Angstroms and the etching time of the isotropic etching step two ranged from 1500 to 2500 Angstroms will result in perfect contact profile, high metal step coverage (that is above about 35%) and low critical dimension loss (that is below about 0.3 micrometers per side). So, for successful production of 0.8 micrometer feature size process, we require these process conditions.

While the invention has been particularly shown and described with reference to the preferred embodiments thereof, it will be understood by those skilled in the art that various changes in form and details may be made without departing from the spirit and scope of the invention.

What is claimed is:

1. A method for making a tapered opening for an integrated circuit having a feature size of about one micrometer or less which will in due course be filled with a metallurgy conductor comprising:
    providing an integrated circuit structure having device elements within a semiconductor substrate and multilayer insulating layers thereover;
    forming a resist masking layer over the said multilayer insulating layer having openings therein in the areas where the said openings are desired;
    anisotropically etching into said multilayer insulating layer through a first thickness to form a first opening using said resist masking layer as a mask;
    isotropic etching through a second thickness portion of said multilayer insulating layer to substantially uniformly enlarge said first opening while using unchanged said resist layer;
    anisotropically etching through the remaining thickness of said multilayer insulating layer to the semiconductor substrate to form said tapered opening with a metal step coverage improvement between about 20 to 60%; and removing the said resist layer.

2. The method of claim 1 wherein said tapered opening is a contact opening through a borosilicate glass layer to regions within said semiconductor substrate.

3. The method of claim 1 wherein said tapered opening is a via opening through a spin-on-glass layer to a metallurgy layer under said spin-on-glass layer.

4. The method of claim 3 wherein said isotropic etching uses a dry ambient of the group consisting of $NF_3$ and $CF_4$ with appropriate time and temperature conditions.

5. The method of claim 2 wherein said isotropic etching uses a wet etchant of $NH_4F$ and HF, with appropriate time and temperature conditions.

6. The method of claim 2 wherein said borosilicate glass is a borophosphosilicate glass having a thickness between about 8000 to 20,000 Angstroms, the said first thickness is between about 1000 to 5000 Angstroms and the said second thickness is between about 1000 to 5000 Angstroms.

7. The method of claim 3 wherein said spin-on-glass is a cured silicate type having a thickness of between about 1000 to 4000 Angstroms, the said first thickness is between about 1000 to 5000 Angstroms and the second thickness is between about 1000 to 5000 Angstroms.

8. The method of claim 3 wherein said spin-on-glass is a cured siloxane type having a thickness of between about 1000 to 4000 Angstroms, the said first thickness is between about 1000 to 5000 Angstroms and the second thickness is between about 1000 to 5000 Angstroms.

9. The method of claim 1 wherein said resist masking layer is a novolac, said anisotropically etching is accomplished using $CHF_3$ ambient whereby there is substantially no erosion of said resist masking layer during said anisotropically and isotropic etching.

10. The method of claim 1 wherein said integrated circuit includes metal oxide semiconductor field effect transistors.

11. The method of claim 1 wherein said integrated circuit includes bipolar transistors.

12. In the method of fabrication of a metal oxide semiconductor field effect integrated circuit having a feature size of about one micrometer or less wherein the semiconductor integrated circuit structure having device elements is covered with a silicon oxide layer and a silicate glass layer, a process for forming tapered contact openings to device elements comprising:
    forming a resist masking layer over the said silicate glass layer having openings therein in the areas where the said contact openings are desired;
    anisotropically etching into said silicate glass layer through a first thickness to form a first opening using said resist masking layer as a mask;
    isotropic etching through a second thickness portion of said silicate glass layer to substantially uniformly enlarge said first opening while using unchanged said resist layer;
    anisotropically etching through the remaining thickness of said silicate glass layer to the semiconductor substrate to form said tapered opening with a metal step coverage improvement between about 20 to 60%; and removing the said resist layer.

13. The method of claim 12 wherein said isotropic etching uses a wet etchant of $NH_4F$ and HF, with appropriate temperature/time conditions.

14. The method of claim 12 wherein said silicate glass is a borophosphosilicate glass having a thickness between about 8000 to 20,000 Angstroms, the said first thickness is between about 1000 to 5000 Angstroms and the said second thickness is between about 1000 to 5000 Angstroms.

15. The method of claim 12 wherein said resist masking layer is a novolac, said anisotropically etching is accomplished using $CHF_3$, $CF_4$ and argon ambient whereby there is substantially no erosion of said resist masking layer during said anisotropically and isotropic etching.

16. In the method of fabrication of a metal oxide semiconductor field effect integrated circuit having a feature size of about one micrometer or less wherein the semiconductor integrated circuit structure having device elements is covered with a composite layer composed of a silicon oxide layer, spin-on-glass and a silicon oxide layer, a process for forming tapered contact openings to device elements comprising:
    forming a resist masking layer over the said composite layer having openings therein in the areas where the said openings are desired;
    anisotropically etching into said composite layer through a first thickness to form a first opening using said resist masking layer as a mask;
    isotropic etching through a second thickness portion of said composite layer to substantially uniformly enlarge said first opening while using unchanged said resist layer;
    anisotropically etching through the remaining thickness of said composite layer to the desired conductive layer forming part of said device elements to form said tapered opening with a metal step coverage improvement between about 20 to 60%; and
    removing the said resist layer.

17. The method of claim 16 wherein said isotropic etching uses a dry etchant of the group consisting of $NF_3$, $CCF_4$ and $CHF_3$ with appropriate temperature/time conditions.

18. The method of claim 16 wherein said spin-on-glass is a cured silicate type glass having a thickness between about 1000 to 3000 Angstroms, the said first thickness is between about 1000 to 5000 Angstroms and the said second thickness is between about 1000 to 5000 Angstroms.

19. The method of claim 16 wherein said spin-on-glass is a cured siloxane type glass having a thickness between about 1000 to 5000 Angstroms, the said first thickness is between about 1000 to 5000 Angstroms and the said second thickness is between about 1000 to 5000 Angstroms.

20. The method of claim 16 wherein said resist masking layer is a novolac, said anisotropically etching is accomplished using $CHF_3$, $CF_4$ and argon plasma whereby there is substantially no erosion of said resist masking layer during said anisotropically and isotropic etching.

* * * * *